United States Patent [19]

Bayruns

[11] Patent Number: 5,047,728

[45] Date of Patent: Sep. 10, 1991

[54] AMPLIFIER HAVING A LOW NOISE ACTIVE GAAS MESFET LOAD

[75] Inventor: Robert J. Bayruns, Middlesex, N.J.

[73] Assignee: Anadigics, Warren, N.J.

[21] Appl. No.: 554,802

[22] Filed: Jul. 18, 1990

[51] Int. Cl.⁵ ............................................... H03F 3/16
[52] U.S. Cl. ..................................... 330/277; 330/286
[58] Field of Search ............... 330/277, 291, 293, 296, 330/302, 307, 308, 286

[56] References Cited

U.S. PATENT DOCUMENTS

4,520,324 5/1985 Jett, Jr. et al. .................. 330/277 X

Primary Examiner—Steven Mottola
Attorney, Agent, or Firm—Mathews, Woodbridge & Collins

[57] ABSTRACT

A high gain, low noise amplifier having an active load with an inductor. The circuit may be fabricated, into a microwave monolithic integrated circuit using GaAs field effect transistors. The amplifier input is connected to the gate terminal of a first MESFET. A DC voltage source is connected to the drain terminal of the first MESFET via a low noise active load device having a second MESFET. The load device also includes an inductor connected between the drain terminal of the first MESFET and the source terminal of the second MESFET. The output terminal of the amplifier is connected to the drain terminal of the first MESFET.

15 Claims, 6 Drawing Sheets

AMPLIFIER HAVING A LOW NOISE ACTIVE GAAS MESFET LOAD

BACKGROUND OF THE INVENTION

1. Field of the Invention

The present invention pertains to GaAs MESFET amplifiers and, more particularly, to a MESFET amplifier having a low noise active load.

2. Description of the Prior Art

In the field of microwave monolithic integrated circuit (MMIC) design, it has been the general practice to employ GaAs MESFET gain stages to produce low noise voltage amplifiers and transimpedance amplifiers. One of the most critical problems confronting designers of MESFET gain stages has been achieving the highest voltage gain with minimum supply voltage, noise and power.

Figure 1:
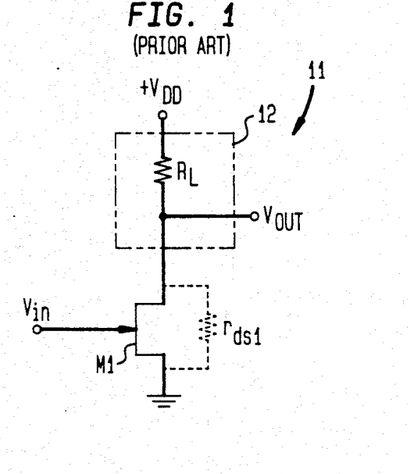
FIGS. 1, 2 and 3 are schematic circuit diagrams of prior art circuits.
Figure 2:
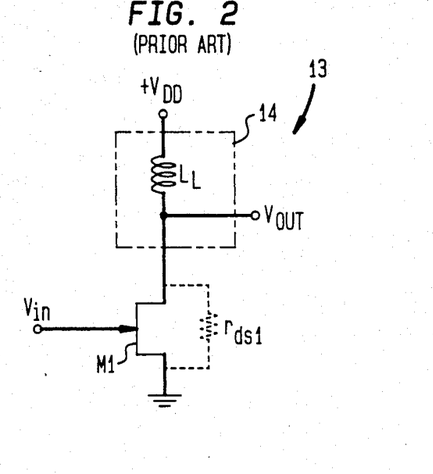
Figure 3:
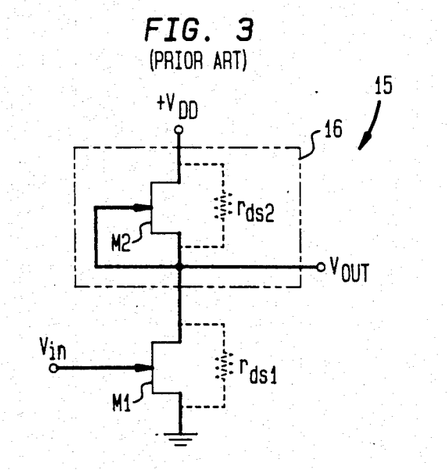

Examples of prior art MMIC amplifiers having FET gain stages may be found in U.S. Pat. Nos. 4,771,247 and 4,496,909. FIGS. 1-3 of the present description shows the basic elements of typical gain stages found in the prior art. Although there has been a long recognized need for MMIC low noise amplifiers capable of having substantial gain with minimum supply voltage and power consumption, no practical solution has heretofore been available. The present invention fulfills this need.

SUMMARY OF THE INVENTION

The general purpose of this invention is to provide a FET load device which can be used to reduce the noise of MMIC gain devices, such as low noise amplifiers and transimpedance amplifiers. To attain this, the present invention contemplates a unique active load for a MMIC gain stage having an inductive element and a FET. The addition of the inductive element causes the effective load impedance to increase from a value equal to the impedance of the FET to infinity as the frequency increases from DC to infinity. Consequently, as the frequency increase, the voltage gain of the amplifier will increase monotonically and will asymptotically approach a value equal to the intrinsic voltage gain of the active element that forms the MMIC.

It is, therefore, an object of the present invention to provide an improved MMIC amplifier.

A further object of the invention is to provide an MMIC amplifier having improved means for increasing gain.

Another object of the invention is to provide an improved low noise MMIC amplifier.

Still another object is to provide a low noise MMIC amplifier having high gain with minimum supply voltage and power consumption.

Other objects and many of the attendant advantages of this invention will be readily appreciated as the same becomes better understood by reference to the following detailed description when considered in connection with the accompanying drawings in which like reference characters designate like parts throughout the figures thereof.

BRIEF DESCRIPTION OF THE DRAWINGS

FIGS. 12, 13 and 14 show applications of the invention while

DETAILED DESCRIPTION OF THE PREFERRED EMBODIMENT

Referring now to the drawings, FIGS. 1, 2 and 3 show typical gain stages of prior art integrated circuits (IC). The FIG. 1 IC represents an amplifier 11 with a resistive load 12. Amplifier 11 includes a conventional MESFET M1 having a grounded source terminal. A voltage input $V_{in}$ is connected to the gate terminal of MESFET M1 while the drain terminal is connected to a direct current (DC) drain supply voltage source $+V_{DD}$ through a load resistor $R_L$. Also connected to the drain terminal is a voltage output $V_{out}$. Typically, the MESFET M1 is fabricated from gallium arsenide (GaAs). The amplifier 11 is often found in the gain stage of a conventional IC such as a microwave monolithic integrated circuit (MMIC). Also shown in FIG. 1 is the effective output resistance $r_{ds1}$ for MESFET M1. The resistance $r_{ds1}$, shown in dashed lines, is conventionally referred to as the small-signal drain-source on-state output resistance.

The second prior art IC is amplifier 13 having an inductive load 14 (FIG. 2). Amplifier 13 has an input $V_{in}$, an output $V_{out}$, a MESFET M1 with a grounded source terminal, DC voltage source $+V_{DD}$ and a load inductor $L_L$. The effective output resistance $r_{ds1}$ of MESFET M1 is shown in dashed lines.

The third prior art IC is amplifier 15 having an active load 16 (FIG. 3). Amplifier 15 has an input $V_{in}$, an output $V_{out}$, a MESFET M1 with an effective output resistance $r_{ds1}$, a DC voltage source $+V_{DD}$, and an active load 16 connected on one of its sides to the drain terminal of MESFET M1 and output $V_{out}$, and on the other of its sides to DC voltage source $+V_{DD}$. Load 16 includes a MESFET M2 having its source terminal and gate terminal connected in common to the output $V_{out}$. The drain terminal of MESFET M2 is connected to the DC voltage source $+V_{DD}$. The effective output resistance $r_{ds2}$ between drain and source to MESFET M2 is shown in dashed line.

The voltage gains $A_{v11}$, $A_{v13}$ and $A_{v15}$ for the ICs shown in FIGS. 1-3, respectively, may be expressed as follows:

$$A_{v11} = (gm_1)(r_{ds1}//R_L) \quad (1)$$

$$A_{v13} = (gm_1)(r_{ds1}//X_L) \quad (2)$$

$$A_{v15} = (gm_1)(r_{ds1}//r_{ds2}) \quad (3)$$

where $gm_1$ is the transconductance of MESFET M1, $X_L$ is the reactance for the load inductor $L_L$, and $(r_{ds1}//R_L)$, $(r_{ds1}//X_L)$ and $(r_{ds1}//r_{ds2})$ respectively represent the conventional combination of parallel resistances and reactances, e.g. $(r_{ds1}//R_L) = (r_{ds1})(R_L)/(r_{ds1}+R_L)$.

Achieving the highest voltage gain with minimum supply voltage $+V_{DD}$ for a gain stage is usually a desirable goal. For the amplifier 11, with the resistive load 12 of FIG. 1, Eq (1) shows that the voltage gain $A_{v11}$ depends on the value of the load resistor $R_L$ in parallel with the output resistance $r_{ds1}$ of the MESFET M1. For typical GaAs MESFETs, transconductance $gm_1$ is bout thirty millimhos (mS) and resistance $r_{ds1}$ is about 500 ohms. With zero DC gate voltage on input $V_{in}$, the DC current $I_{DD}$ that flows in MESFET M1 is about thirty milliamps (mA). To achieve a high voltage gain $A_{v11}$, the resistance of load resistor $R_L$ should be made as large as possible. However, a large load resistor $R_L$ requires a large supply voltage $+V_{DD}$. For example, for a load resistor $R_L$ of 500 ohms with current $I_{DD}$ of 30 mA, the supply voltage $+V_{DD}$ would have to be equal to or greater than 15 V. The voltage gain $A_{v11}$ normally achievable is about 7.5 db, at a power dissipation of 0.45 watts. In many systems, a supply voltage $+V_{DD}$ of only five volts is usually required, in which case the gain $A_{v11}$, using the above example, would be only about 3.5 db.

For the inductive load circuit 13 of FIG. 2, there is no DC voltage drop across the inductor $L_L$ making an operating supply voltage $+V_{DD}$ of five volts possible. But the typical maximum inductance achievable monolithically on a GaAs MESFET is only about 15 nanohenry (nH). At 100 megahertz (MHz) and one gigahertz (1 GHz), the voltage gains achievable, using Eq. (2), are:

$$(f=100\ MHz)\ A_{v13}=(gm_1)(X_L//500)=0.3 db \qquad (4)$$

$$(f=1\ GHz)\ A_{v13}=2.8 db \qquad (5)$$

where:

$$(f=100\ MHz)\ X_L=2\pi f L_L=9.42\ ohms \qquad (6)$$

$$(f=1\ GHz)\ X_L=94.2\ ohms \qquad (7)$$

and transconductance $gm_1$ is 0.03 mS. From Eqs. (4) and (5), it can be seen that the voltage gains $A_{v13}$ achievable with reasonable inductive loads $L_L$ are relatively low at the frequencies indicated.

The highest voltage gain with a source $+V_{DD}$ of 5 V for the three ICs in FIGS. 1–3 is achieved with the amplifier 15 (FIG. 3). A typical voltage gain $A_{v15}$, using Eq. (3), is as follows:

$$A_{v15}=(gm_1)(r_{ds1}//r_{ds2})=(0.03)(250)=7.5\ db \qquad (8)$$

where $gm_1$ is 0.03 mS, and $r_{ds1}$ and $r_{ds2}$ are each 500 ohms. But, as will be described later, of the three amplifiers shown in FIGS. 1–3, the circuit of FIG. 3 also adds the most noise. On the other hand, the FIG. 4 amplifier 17, the preferred embodiment, has maximum gain with relatively low noise.

Figure 4:
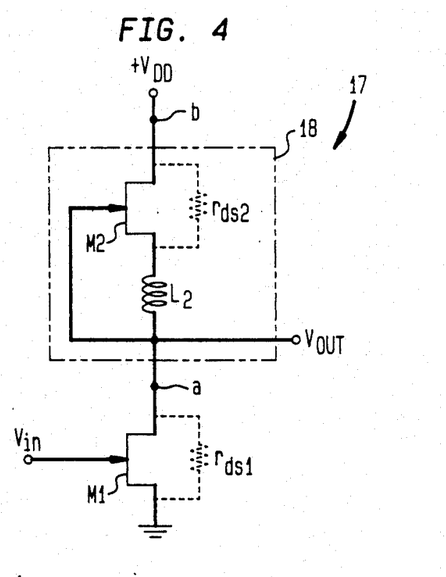
FIG. 4 is a schematic circuit diagram illustrating the preferred embodiment.

FIG. 4, a schematic circuit diagram of the preferred embodiment, shows amplifier 17 formed from a conventional MESFET M1 with a grounded source terminal, an input $V_{in}$ connected to the gate terminal, and a drain terminal connected to an active load 18 and an output $V_{out}$. The active load 18 includes a typical MESFET M2 having its drain terminal connected to DC voltage source $+V_{DD}$ and its gate terminal connected to output $V_{out}$. The source terminal of MESFET M2 is connected to output $V_{out}$ via an inductor L2. MESFET effective output resistances are shown in dashed lines as resistances $r_{ds2}$ and $r_{ds1}$.

The effective load impedance $Z_{ab}$ for the load 18 is:

$$Z_{ab}=r_{ds2}(1+gm_2 X_{L2})+X_{L2} \qquad (9)$$

where $Z_{ab}$ is the impedance between points (a) and (b) (FIG. 4), $gm_2$ is the transconductance of MESFET M2, and $X_{L2}$ is the reactance of inductor L2.

Figure 5:
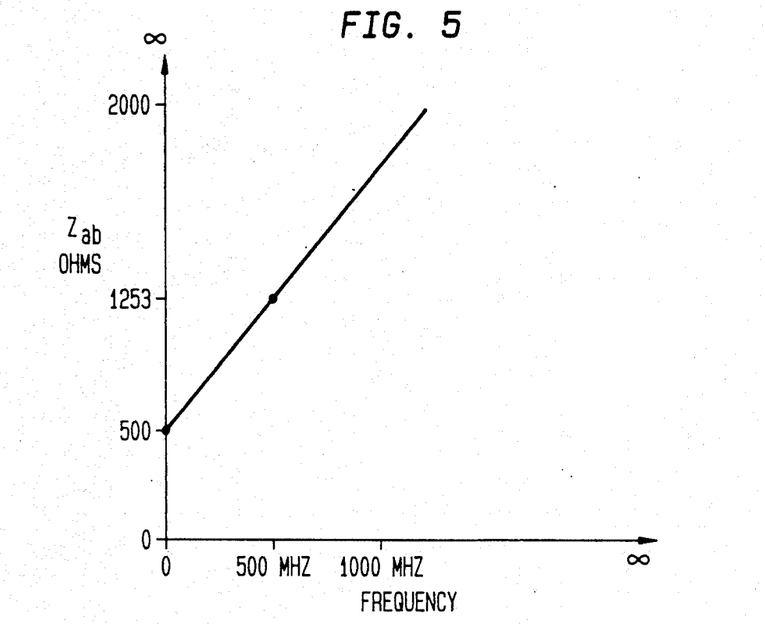
FIGS. 5-6 are graphs useful in understanding the operation of the FIG. 4 embodiment.

A plot of the ideal load impedance $Z_{ab}$ vs. frequency is shown in FIG. 5 for an amplifier 17 having typical values wherein the inductance of inductor L2 is 15 nH, the transconductance $gm_2$ is 0.032 mS and the output resistance $r_{ds2}$ is 500 ohms. With the input $V_{in}$ of amplifier 17 at DC (zero frequency), the impedance $Z_{ab}$ will have the same value as the value of the load impedance in the amplifier 15 (FIG. 3), i.e., for the typical example $r_{ds2}=500$ ohms at zero frequency. But, as the frequency increases to infinity, $X_{L2}$ goes to infinity causing the load impedance $Z_{ab}$ to also go to infinity (FIG. 5).

Figure 6:
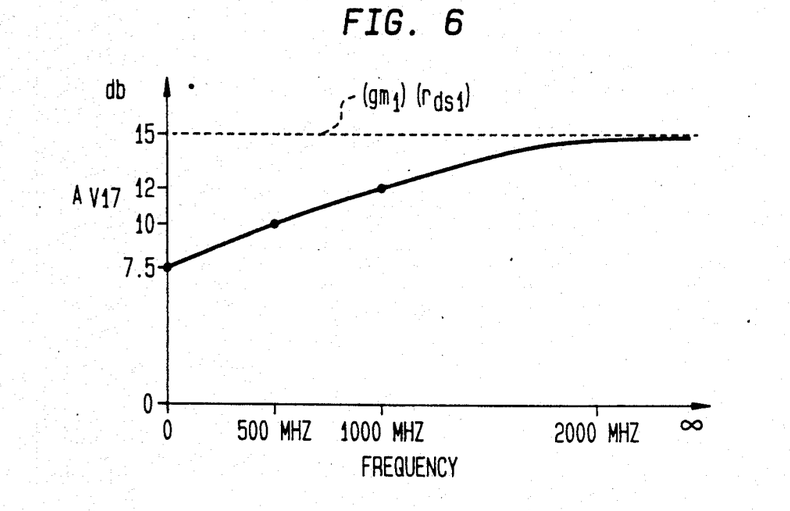

The voltage gain $A_{v17}$ for amplifier 17 is shown in FIG. 6 as a function of frequency for a voltage source $+V_{DD}$ of 5V. As seen in FIG. 6, the voltage gain $A_{v17}$ is equal to the gain $A_{v15}$ at DC (7.5 dB) and at infinite frequency depends only on the intrinsic voltage gain of the MESFET M1. More specifically, at infinite frequency, the gain $Av_{17}$ is as follows:

$$A_{v17}=(gm_1)(r_{ds1}//\infty)=(gm_1)(r_{ds1}) \qquad (10)$$

The power dissipation of the active load 18 for the typical example is 0.15 W at a voltage source $+V_{DD}$ of 5 V. As is now evident from the values in FIG. 6, the amplifier 17 (FIG. 4) can have high gain $A_{v17}$ with only low voltage at source $+V_{DD}$ and low power consumption. As the frequency increases (FIG. 6), the gain $A_{v17}$ asymptotically increases to the intrinsic gain of the MESFET M1 (Eq. 10). It will now be demonstrated that the amplifier 17 of FIG. 4 also has relatively low noise as compared to the ICs of FIGS. 1–3.

Figure 7:
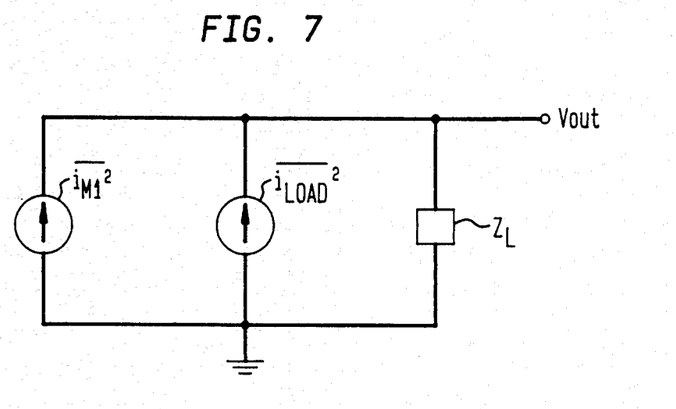
FIG. 7 is a schematic diagram of a generic equivalent circuit useful in analyzing the circuits of FIGS. 1-4.

FIG. 7 illustrates a generic equivalent circuit useful in analyzing the output noise voltage $V_{out}$ that is produced by input noise currents. In general, at the output of a gain stage (with the input shorted to ground), a root mean square (RMS) noise voltage can be measured. For ease of calculation, the output noise is reflected to the input so it can be compared with the input signal level and the signal-to-noise ratio can be calculated.

For alternating currents, the DC voltage source $+V_{DD}$ is at AC ground. Therefore, with input $V_{in}$ and source $+V_{DD}$ at AC ground, the AC equivalent circuit for each of the amplifiers 11, 13, 15 and 17 is shown in FIG. 7. The current source designated $\overline{i_{M1}^2}$ represents the noise currents generated by MESFET M1. The current source designated $\overline{i_{load}^2}$ represents the noise current generated by the respective loads 12, 14, 16, 18. The effective load impedance $Z_L$ is shown connected between output $V_{out}$ and ground. The effective impedance $Z_L$ is the parallel combination of the impedances of MESFET M1 and the respective loads 12, 14, 16, 18.

For a MESFET, the relationship between the drain current $i_d$ and gate voltage $V_g$ is:

$$i_d=gm V_g \qquad (11)$$

Therefore, for noise calculations:

$$\overline{V_g}^2 = \overline{i_d}^2/\overline{gm}^2 \qquad (12)$$

For the circuit of FIG. (7), the RMS noise current $\overline{i_d}^2$ (the RMS drain current for MESFET M1) at the output $V_{out}$ is the sum of the RMS noise currents as follows:

$$\overline{i_d}^2 = \overline{i_{M1}}^2 + \overline{i_{load}}^2 \qquad (13)$$

Using the relationship of Equation 12, the equivalent input referred noise voltage which produces the total output noise current is then as follows:

$$\overline{V_{in}}^2 = (\overline{i_{M1}}^2 + \overline{i_{load}}^2)/\overline{gm_1}^2 \qquad (14)$$

where the gate voltage $V_g$ in Eq (12) is replaced by input $V_{in}$. For a MESFET in general, the drain RMS noise current produced by the MESFET is:

$$\overline{i_d}^2 = 4KT\Gamma gm\Delta f \qquad (15)$$

where K is Boltzman's constant, T is absolute temperature, $\Gamma$ is the noise factor for the particular MESFET, gm is the MESFET transconductance and $\Delta f$ is the measurement bandwidth. The term 4KT is equal to $4.4 \times 10^{-21}$ joules at room temperature. The noise factor $\Gamma$ for a conventional GaAs MESFET is typically 1.1 units.

For the resistive load 12 (FIG. 1), the noise current produced by the resistor $R_L$ is:

$$\overline{i_{load}}^2 = (4KT\Delta f)/R_L \qquad (16)$$

For the ideal inductive load 14 (FIG. 2), the noise current produced by inductor $L_L$ is zero. For the low noise active load 18 (FIG. 4), the effective transconductance gm* between points a and b can be expressed as:

$$gm^* = gm_2/(1 + gm_2 Z_{L2}) \qquad (17)$$

where gm* is the effective transconductance of the load 18, $gm_2$ is the transconductance of MESFET M2 and $Z_{L2}$ is ideally $2\pi fL_2$. Using Eqs. (15) and (17), the noise current produced by the load 18 of FIG. 4 is:

$$\overline{i_{load}}^2 = 4KT\Gamma gm^*\Delta f \qquad (18)$$

Figure 8:
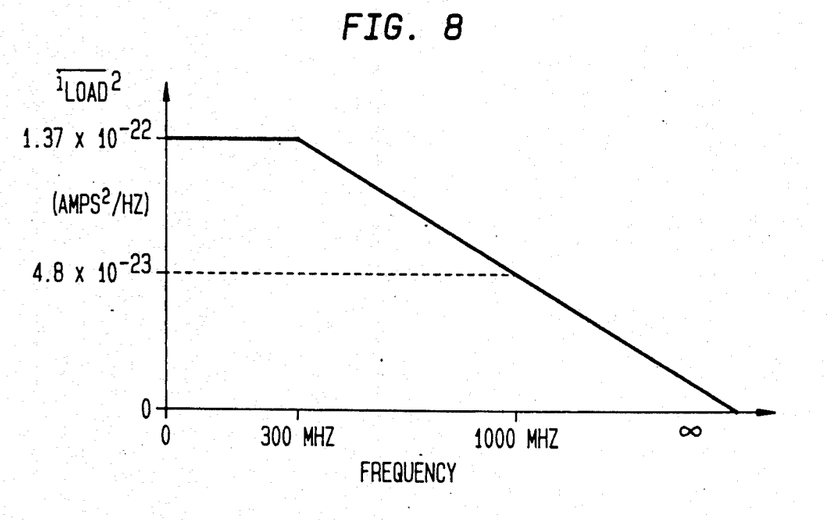
FIG. 8 is a graph useful in understanding the operation of teh FIG. 4 device.

A representative plot of the noise current $\overline{i_{load}}^2$ for load 18 versus frequency is shown in FIG. 8 where $L_2$ is 15 nH, $gm_2$ is 0.03 mS, $\Gamma$ is 1.1 units, 4KT is $(4.4)10^{-21}$ joules and $\Delta f$ is one Hertz. FIG. 8 shows that as the frequency approaches infinity the noise current $\overline{i_{load}}^2$ from the low noise active load 18 goes to zero.

The input referred noise $\overline{V_g}^2$ for the circuits in FIGS. 1-4 is as follows:

Resistor load 12 (FIG. 1):
$$\overline{V_{g11}}^2 = 4KT\Delta f(gm_1 + (1/R_L))gm_1^2 \qquad (19)$$

Inductor load 14 (FIG. 2): $\overline{V_{g13}}^2 = 4KT\Delta f/gm_1 \qquad (20)$ Active load 16 (FIG. 3):
$$\overline{V_{g15}}^2 = 4KT\Delta f(gm_1 + gm_2)/gm_1^2 \qquad (21)$$

Low noise active load 18 (FIG. 4):

$$\overline{V_{g17}}^2 = 4KT\Delta f(gm_1 + (gm_2/(1+gm_2 Z_s)))/gm_1^2 \qquad (22)$$

TABLE I summarizes values for representative voltage gains $A_{v11}$, $A_{v13}$, $A_{v15}$ and $A_{v17}$; RMS values of input noise voltages $V_{g11}$, $V_{g13}$, $V_{g15}$ and $V_{g17}$; and noise figures $NF_{11}$, $NF_{13}$, $NF_{15}$ and $NF_{17}$ for the respective amplifiers 11, 13, 15 and 17. The table values are obtained using Eqs. (1), (2), (3), (4), (19), (20), (21) and (22) and the following typical values: $\Delta f = 1$ GHz; $4KT = (4.4)10^{-21}$ J; $\Gamma = 1.1$; $V_{DD} = 5$V; $gm_1$ and $gm_2 = 0.03$ mS; and $r_{ds1}$ and $r_{ds2} = 500$ ohms. The noise figures $NF_{11}$, $NF_{13}$, $NF_{15}$ and $NF_{17}$ in the table were calculated using the following equation:

$$NF = 10 \log (1 + \overline{V_g}^2/\overline{V_{50}}^2) \qquad (23)$$

where $\overline{V_{50}}^2$ is the noise voltage produced by a 50 ohm source resistor, i.e. $\overline{V_{50}}^2 = (8.3)10^{-19} V^2/Hz$.

TABLE I

| Voltage Gain (dB) | Input Noise ($10^{-19} V^2/Hz$) | Noise Figure (dB) |
|---|---|---|
| $A_{v11} = 3.5$ | $\overline{V_{g11}}^2 = 7$ | $NF_{11} = 2.65$ |
| $A_{v13} = 2.8$ | $\overline{V_{g13}}^2 = 6$ | $NF_{13} = 2.36$ |
| $A_{v15} = 7.5$ | $\overline{V_{g15}}^2 = 11$ | $NF_{15} = 3.7$ |
| $A_{v17} = 12$ | $\overline{V_{g17}}^2 = 7.7$ | $NF_{17} = 2.85$ |

From TABLE I, it can be seen that the voltage gain $A_{v17}$ for amplifier 17, the preferred embodiment (FIG. 4), is the highest, i.e. $A_{v17} = 12$ db. The noise figure $NF_{15}$ for the active load 16 of amplifier 15 is the highest, i.e. $NF_{15} = 3.7$ db, and $NF_{17}$ is second highest.

Figure 9:
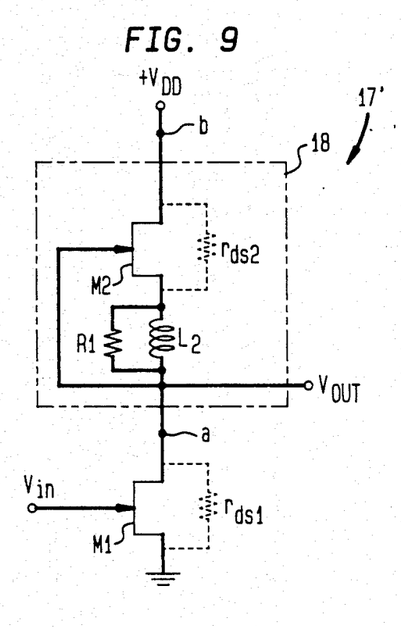
FIGS. 9 and 10 are schematic circuit diagrams showing alternate embodiments of the invention.
Figure 10:
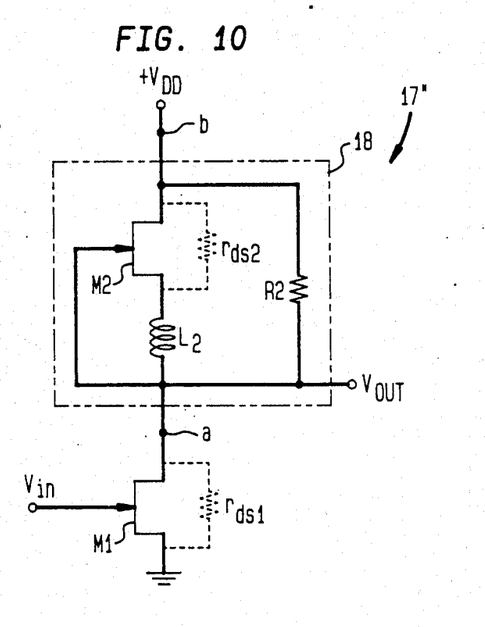
Figure 11:
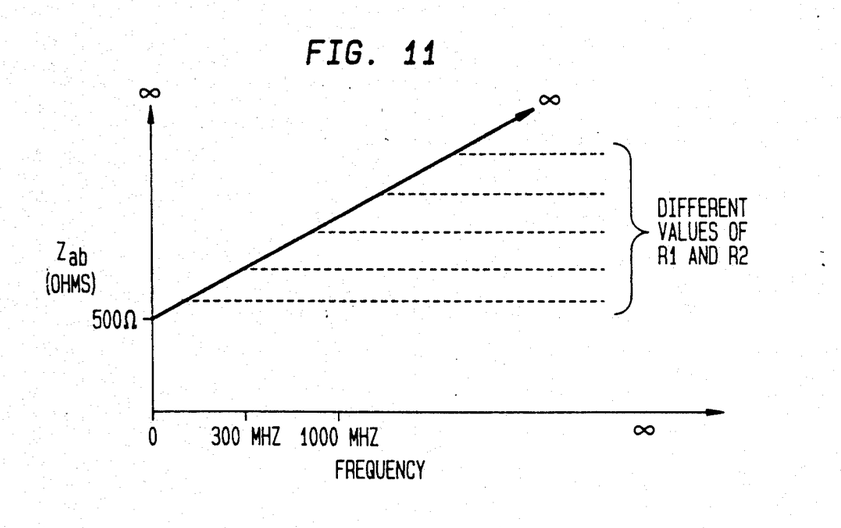
FIG. 11 is a graph useful in understanding the circuits of FIGS. 9 and 10.

FIGS. 9 and 10 show modified amplifiers 17' and 17'', respectively. Amplifier 17' includes all of the elements of the preferred embodiment of FIG. 4 plus a resistor R1 connected in parallel across the inductor $L_2$. Amplifier 17'' (FIG. 10) includes the elements of the FIG. 4 embodiment plus a resistor R2 connected in parallel across the series combination of the inductor $L_2$ and the MESFET M2. FIG. 11 illustrates the effects of adding the respective resistors R1, R2, as shown in FIGS. 9 and 10, to the basic amplifier 17. The resistors R1 and R2 will flatten out the voltage gain $A_{v17}$. The curve of FIG. 11, similar to that of FIG. 5, shows several dashed lines of reduced slope that represent the values of the effective load impedances $Z_{ab}$ of the amplifiers 17' and 17'' for various values of resistors R1 and R2.

Figure 12:
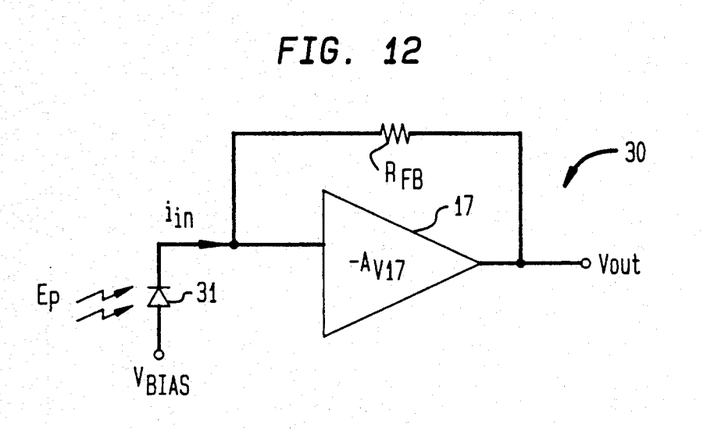
Figure 13:
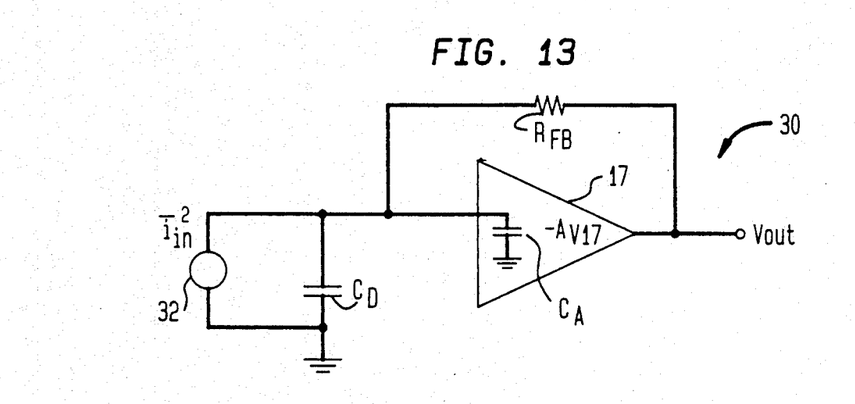

The amplifier 17, having the low noise active load 18, is ideally suited for use in the fiber optic transimpedance amplifier 30 shown in FIG. 12. A photo signal of energy $E_P$ impinging upon a biased ($V_{bias}$) photo detector diode 31 produces a small photo current $i_{in}$ at the input to amplifier 17 having a negative gain $-A_{v17}$. As such, transimpedance amplifier 30 will produce an output voltage $V_{out} = (i_{in})(R_{FB})$, where $R_{FB}$ is the resistance of feedback resistor $R_{FB}$. The photo detector diode 31, being a high impedance device, can be modeled as a current source 32, with photo current $i_{in}$, having a capacitive impedance modeled by capacitance $C_D$ as shown in the equivalent circuit of FIG. 13. The two equivalent capacitances $C_D$ and $C_A$ are the inherent capacitances of diode 31 and the transimpedance amplifier 30. The 3 db bandwidth $f_{3db}$ of the amplifier 30 is given as follows:

$$f_{3db} = \tfrac{1}{2}\pi C_T R_{in} \qquad (24)$$

where $C_T = C_D + C_A$, i.e. The total capacitance at the input, and $R_{in} = R_{FB}/(1 + A_{v17})$. As such, Equation (24) may be written as follows:

$$f_{3db} = (1 + A_{v17})/R_{FB} 2\pi C_T \qquad (25)$$

It can be seen from Equation (25) that the larger the voltage gain $A_{v17}$, the higher will be the bandwidth $f_{3db}$.

Also, it was shown above that the amplifier 17 had the highest overall voltage gain $A_{v17}$ for a 5 volt power supply.

Figure 14:
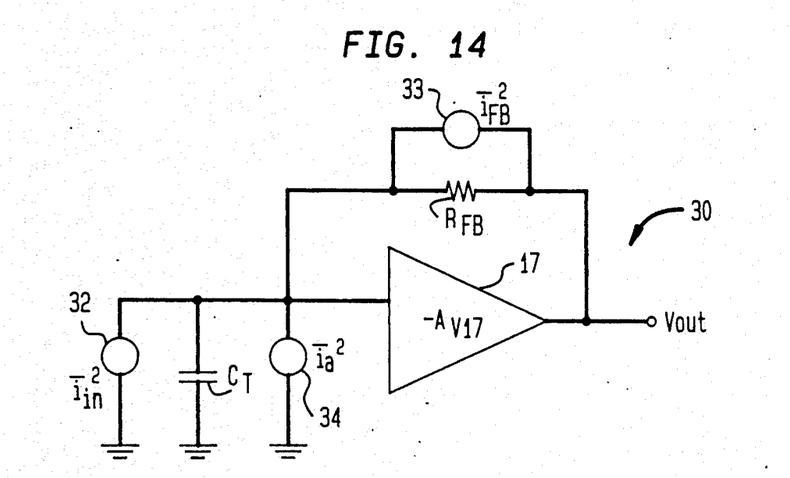

The amplifier 17 also provides the lowest noise for use in the transimpedance amplifier 30. FIG. 14 is an equivalent unit for amplifier 30 showing the dominant noise sources. Noise source 33 produces a noise current $\overline{i_{FB}}^2$ due to feedback resistor $R_{FB}$. Noise source 34 produces a noise current $\overline{i_a}^2$ due to the input referred noise. The feedback resistor noise current $\overline{i_{FB}}^2$ may be calculated as follows:

$$\overline{i_{FB}}^2 = 4KT\Delta f/R_{FB} \qquad (26)$$

From Equation (26) it is seen that it is desirable to increase the value of resistor $R_{FB}$ to lower the noise. But Equation (25) shows that this would cause a loss in 3 db bandwidth. Consequently, the amplifier with the highest voltage gain will result in the lowest noise design.

The input referred circuit noise current $\overline{i_a}^2$ is typically produced by a preceding input voltage gain stage, e.g. of the type shown in FIGS. 1-4. In general, since the photo diode 31 (FIG. 12) is a current source, the noise current $\overline{i_a}^2$ may be calculated using the noise voltage equivalent circuits, i.e. by dividing the voltage noise generators $\overline{V_g}^2$ by the total capacitance $C_T$ as follows:

$$\overline{i_a}^2 = \overline{V_g}^2/(2\pi C_T)^2 \qquad (27)$$

For the amplifier 17 (FIG. 4):

$$\overline{i_{a17}}^2 = 4KTT\Delta f(gm_1+gm_2)/b+gm_2Z_s)/(2\pi)^2 C_T^2 g_{m2} \qquad (28)$$

While $\overline{V_{g17}}^2$ (TABLE I) and, hence, $\overline{i_{a17}}^2$ are not the lowest, the gain $A_{v17}$ is the highest and results in a larger possible feedback resistor $R_{FB}$ and hence the lowest total noise.

Figure 15:
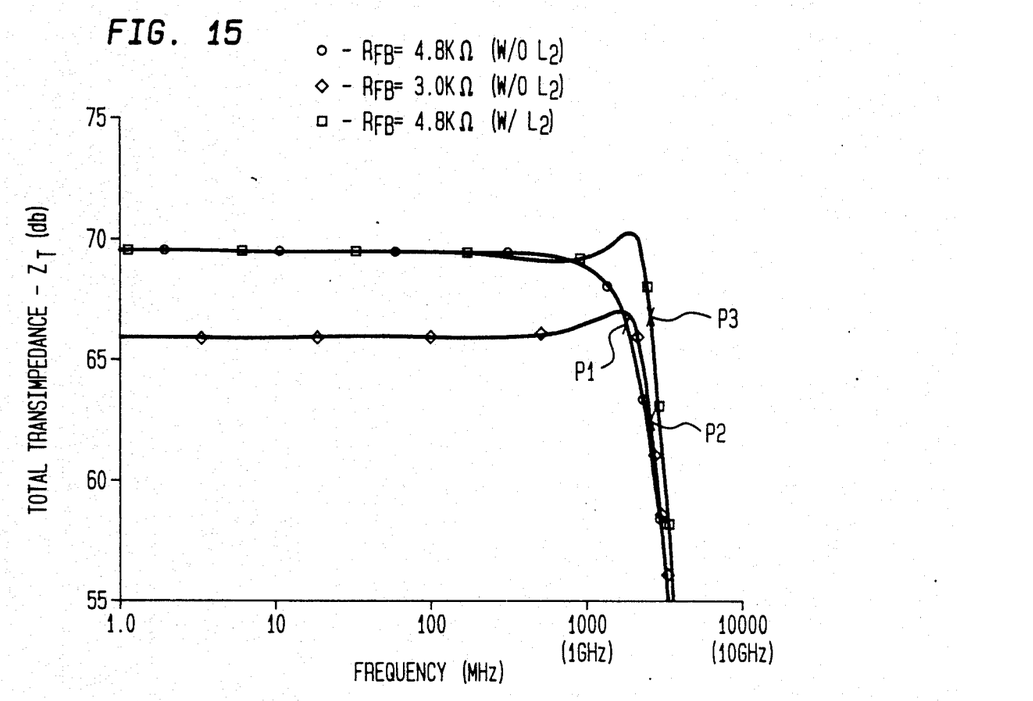
FIGS. 15 and 16 are graphs useful in understanding FIGS. 12, 13 and 14.
Figure 16:
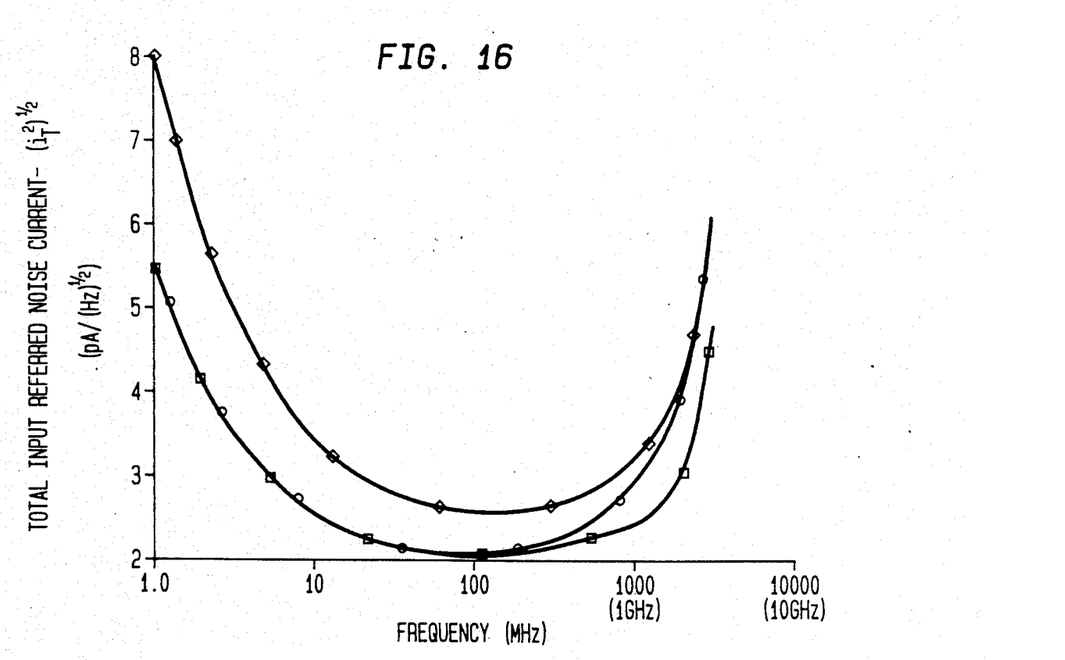

FIGS. 15 and 16 compares the frequency response of a transimpedance amplifier 30, using the amplifiers 17 of FIG. 4, with two identical transimpedance amplifiers wherein there is no inductor $L_2$ and in one case the feedback resistor $R_{FB}$ is smaller. In FIGS. 15 and 16, the curve defined by the small squares represents the frequency response for amplifier 30 with a feedback resistor $R_{FB}$ of 4.8 kilohms. The curve defined by small circles is for an identical amplifier but with no inductor $L_2$. The curve defined by small triangles is also for an identical amplifier but with no inductor $L_2$ and wherein the feedback resistor $R_{FB}$ is smaller, i.e. 3.0 kilohms.

FIG. 15 is a plot of the total transimpedance $Z_T$, where $Z_T = 20 \log (V_{out}/i_{in})$ The units for $Z_T$ are shown in FIG. 15 as decibels (db) in accordance with convention. The actual units are ohms db. The frequency range, plotted on a logarithmic scale, extends from one megahertz (MHz) to 10,000 MHz, i.e. 10 gigahertz (GHz). The upper ends of the three db bandwidths are shown on the three curves as points P1, P2 and P3.

The curves of FIG. 15 show that the amplifier 17, having the inductor $L_2$, results in a transimpedance amplifier 30 that has the largest 3 db bandwidth for a given value of the resistor $R_{FB}$, i.e. The frequency at point P3 is greater than the frequency at point P1. FIG. 15 also demonstrates that for an amplifier without the inductor $L_2$, the gain or total transimpedance $Z_T$ can be increased by increasing the feedback resistor $R_{FB}$. (Compare the diamond curve with the circle curve). However, as a result, the 3 db bandwidth is reduced, i.e. The frequency at point P1 is less than the frequency at point P2.

To summarize, although the gain of a transimpedance amplifier using the prior art (FIG. 3) amplifier 16 (active load with no inductor $L_2$) can be increased by increasing the feedback resistor $R_{FB}$, this gain increase comes at the expense of reducing the bandwith However, with the introduction of the inductor $L_2$ as shown in amplifier 17 (FIG. 4), the resulting transimpedance amplifier 30 will attain both a higher gain and a greater bandwidth when feedback resistor $R_{FB}$ is increased.

The total input referred noise $(\overline{i_T}^2)^{\frac{1}{2}}$ for the three situations of FIG. 15, is shown in FIG. 16. The RMS total input referred noise $\overline{i_T}^2$ is the RMS sum as follows:

$$\overline{i_T}^2 = \overline{i_a}^2 + \overline{i_{FB}}^2 \qquad (29)$$

At mid-band, about 100 MHz (FIG. 16), the amplifier without the inductor $L_2$ and with a feedback resistor $R_{FB}$ of 3.0 kilohms (small diamonds in FIG. 16) shows the highest noise. The mid-band noise may be reduced by simply increasing the feedback resistor $R_{FB}$ to 4.8 !0 kilohms (small circles in FIG. 16). Although this is an advantage at mid-band, it is seen that the advantage vanishes as the frequency increases. Specifically, the noise for both curves becomes equal as the frequency increases, i.e. The diamond curve and the circle curve approach each other at large frequency values in FIG. 16. However, the amplifier 17, with the inductor $L_2$, has the lowest noise for all frequencies above mid-band (100 MHz in FIG. 16). For frequencies below mid-band (below 100 MHz), the dominant term in Equation 29 is $i_{FB}^2$, i.e. The feedback noise current primarily determines the frequency response below mid-band. For frequencies above mid-band (above 100 MHz), the dominant term in Equation 29 is $\overline{i_a}^2$. As such, the use of inductor $L_2$ in the active load produces an amplifier, amplifier 17, with less noise and more voltage gain.

It should be understood, of course, that the foregoing disclosure relates to only a preferred embodiment of the invention and that numerous modifications or alterations may be made therein without departing from the spirit and the scope of the invention as set forth in the appended claims.

What is claimed is:

1. An amplifier comprising:
   a first field effect transistor having first, second and third contacts including gate, drain and source terminals, respectively;
   a signal input terminal connected to said gate terminal of said first field effect transistor;
   a signal output terminal connected to said drain terminal of said first field effect transistor;
   an inductor connected to the drain terminal of said first field effect transistor;
   an active load connected in series with said inductor, said active load including a second field effect transistor having a gate terminal connected to said signal output terminal, a source terminal connected in series with its said inductor and a drain terminal; and,
   a DC voltage source connected to said drain terminal of said second field effect transistor.

2. An amplifier for connection between a DC voltage source and ground comprising:
   a first field effect transistor having a gate, source and drain terminal, said source terminal of said first field effect transistor conneeted to said ground;

a signal input terminal connected to said gate terminal of said first field effect transistor;

a signal output terminal connected to said drain terminal of said first field effect transistor;

an inductor having a first and second terminal, said first terminal of said inductor connected to said drain terminal of said first field effect transistor; and, a second field effect transistor having a gate, source and drain terminal, said source terminal connected to said second terminal of said inductor, said drain terminal connected to said DC voltage source and said gate terminal connected to said signal output terminal.

3. An amplifier for connection between a DC voltage source and ground comprising:

a first transistor having first, second and third contacts, said second contact of said first transistor connected to said ground;

a signal input terminal connected to said first contact of said first transistor;

a signal output terminal connected to said third contact of said first transistor;

an inductor having a first and a second terminal, said first terminal of said inductor connected to said third contact of said first transistor; and, a third transistor having a first, second and third contact, said second contact of said second transistor connected to the second terminal of said inductor, said third contact of said second transistor connected to said DC voltage source and said first contact of said second transistor connected to said signal output terminal.

4. The amplifier of claim 3 wherein said first transistor comprises a field effect transistor and wherein said first, second and third contacts of said first transistor correspond, respectively, to the gate, source and drain terminals of said first field effect transistor.

5. The amplifier of claim 3 wherein said second transistor comprises a second field effect transistor and wherein said first, second and third contacts of said second transistor correspond, respectively, to the gate, source and drain contacts of said second field effect transistor.

6. The amplifier of claim 3 further including a resistor connected across said inductor.

7. The amplifier of claim 3 further including a resistor connected between the signal output terminal and said DC voltage source.

8. The amplifier of claim 3 further including a feedback resistor connected between said signal output terminal and said signal input terminal.

9. The amplifier of claim 8 further including a current source connected to said signal input terminal.

10. The amplifier of claim 9 wherein said current source is a photodetector diode.

11. The amplifier of claim 12 further including a resistor connected across said inductor.

12. The amplifier of claim 12 further including a resistor connected between said output terminal and said DC voltage source.

13. The amplifier of claim 12 further including a feedback resistor connected between said signal output terminal and said signal input terminal.

14. The amplifier of claim 13 further including a current source connected to said signal input terminal.

15. The amplifier of claim 19 wherein said current source is a photo detector diode.

* * * * *